(12) United States Patent
Kim

(10) Patent No.: US 6,878,597 B2
(45) Date of Patent: Apr. 12, 2005

(54) METHODS OF FORMING SOURCE/DRAIN REGIONS USING MULTILAYER SIDE WALL SPACERS AND STRUCTURES SO FORMED

(75) Inventor: Do-Hyung Kim, Seoul (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 10/397,970

(22) Filed: Mar. 26, 2003

(65) Prior Publication Data

US 2003/0186508 A1 Oct. 2, 2003

(30) Foreign Application Priority Data

Mar. 26, 2002 (KR) .................. 10-2002-0016329

(51) Int. Cl.[7] ............... H01L 21/336; H01L 21/3205; H01L 21/44; H01L 29/76
(52) U.S. Cl. ............... 438/303; 438/595; 438/655; 257/384
(58) Field of Search ............... 438/301, 303, 438/306, 366, 595, 655; 257/384

(56) References Cited

U.S. PATENT DOCUMENTS

| | | | | |
|---|---|---|---|---|
| 5,763,312 A | * | 6/1998 | Jeng et al. ............... | 438/303 |
| 6,004,852 A | * | 12/1999 | Yeh et al. ............... | 438/303 |
| 6,017,784 A | * | 1/2000 | Ohta et al. ............... | 438/197 |
| 6,153,457 A | * | 11/2000 | Kuo ............... | 438/233 |
| 6,329,225 B1 | * | 12/2001 | Rodder ............... | 438/151 |
| 6,380,053 B1 | * | 4/2002 | Komatsu ............... | 438/517 |
| 6,693,013 B2 | * | 2/2004 | Bae et al. ............... | 438/303 |

* cited by examiner

Primary Examiner—Matthew Smith
Assistant Examiner—Lex H. Malsawma
(74) Attorney, Agent, or Firm—Myers Bigel Sibley & Sajovec (57) ABSTRACT

Methods of forming a source/drain region can include the steps of forming a gate electrode on a substrate and forming a lightly doped source/drain region in the substrate self-aligned to the gate electrode. A first spacer can be formed on a side wall of the gate electrode. A second spacer can be formed on the first spacer on the side wall separate from the first spacer to provide a multilayer spacer on the side wall. A heavily doped source/drain region can be formed in the substrate self-aligned to the multilayer spacer. Related structures are also disclosed.

18 Claims, 10 Drawing Sheets

Fig. 1

(Prior Art)

Fig. 2

(Prior Art)

Fig. 3

(Prior Art)

Fig. 4

(Prior Art)

Fig. 5

(Prior Art)

Fig. 6

(Prior Art)

Fig. 7

(Prior Art)

METHODS OF FORMING SOURCE/DRAIN REGIONS USING MULTILAYER SIDE WALL SPACERS AND STRUCTURES SO FORMED

CLAIM FOR PRIORITY

This application claims priority to Korean Patent Application No. 2002-16329, filed on Mar. 26, 2002, the entire contents of which are incorporated herein by reference.

FIELD OF THE INVENTION

The present invention relates to method for fabricating semiconductor devices, and more particularly, to methods of fabricating semiconductor devices including MOS transistors and devices so formed.

BACKGROUND

As the level of integration in MOS transistors increases, the associated design rule can be reduced to provide smaller source/drain regions. Especially, in MOS transistors (e.g., MOSFET) with a lightly doped region, a contact region may become smaller due to spacers formed on side walls of a gate electrode of the MOSFET.

Contacts have been used in various types of devices, such as dynamic random access memory (DRAM), static random access memory (SRAM), and central processing units (CPUs), connecting impurity regions (source/drain regions) to interconnection structures in the MOSFET (such as a bit line).

FIGS. 1 to 7 are cross-sectional views illustrating conventional methods for fabricating semiconductor devices including MOS transistors with contacts.

Figure 1:
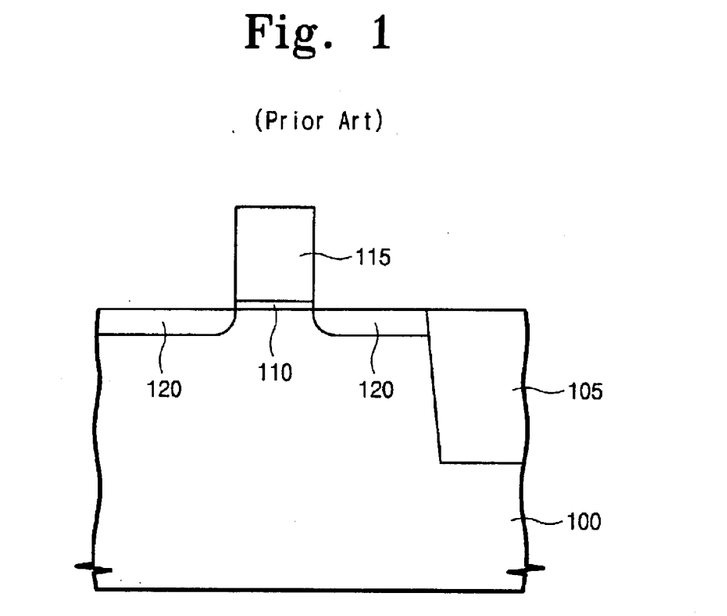
FIGS. 1 to 7 are cross-sectional views illustrating methods of fabricating conventional semiconductor devices having contacts connected to a MOS transistor.

Referring to FIG. 1, a field region 105 is formed in a substrate 100 to define an active region. That is, the substrate 100 is etched to form a trench, and the trench is filled with a sufficient insulating material. The resultant structure is polished using chemical mechanical polishing (CMP) to form the field region 105.

Next, an insulation layer and a gate conductive layer are sequentially stacked on the substrate where the field region 105 is formed and then patterned to form a gate electrode 115. A gate insulation layer 110 is located between the substrate 100 and the gate electrode 115. Impurity ions are implanted at a low concentration using the gate electrode 115 and the field region 105 as an ion implantation mask, thereby forming lightly doped source/drain regions 120.

Figure 2:
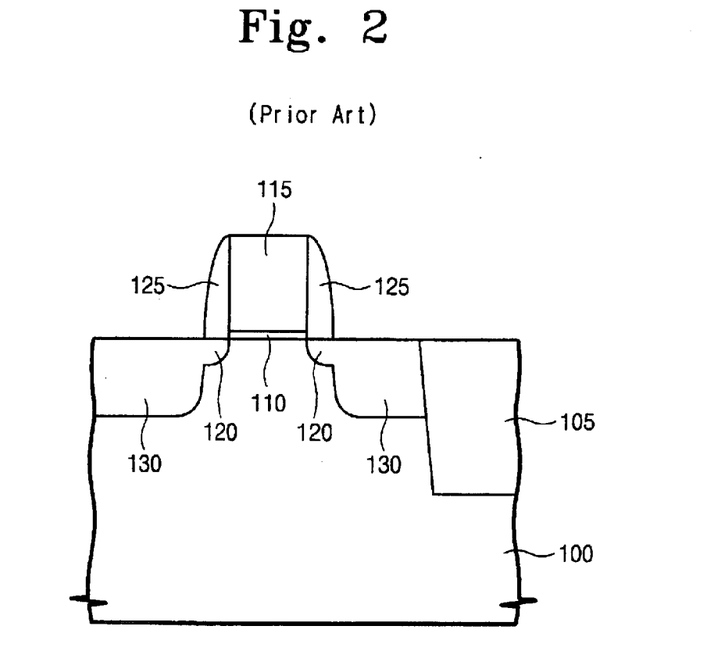

Referring to FIG. 2, a spacer insulation (or insulating) layer is formed on an entire surface of the substrate including the gate electrode 115 and is etched to form spacers 125 on side walls of the gate electrode 115. Thereafter, by using the gate electrode 115, the spacer 125, and the field region 105 as an ion implantation mask, impurity ions are implanted at a high concentration to form heavily doped source/drain regions 130. The lightly and heavily doped source/drain regions 120 and 130 correspond to source and drain regions of a MOS transistor. The transistor having the foregoing structure is sometimes referred to as an "LDD structure" and is widely used. As is well known, in MOS transistors with an LDD structure, a lightly doped region is self-aligned to a gate electrode and is located between a channel region and a heavily doped region. A lightly doped region can decrease an electric field between the drain and the channel region. Thus, if a high voltage is applied, carriers emitted from the source may not accelerate rapidly thereby possibly reducing or avoiding "hot carrier" effects.

Figure 3:
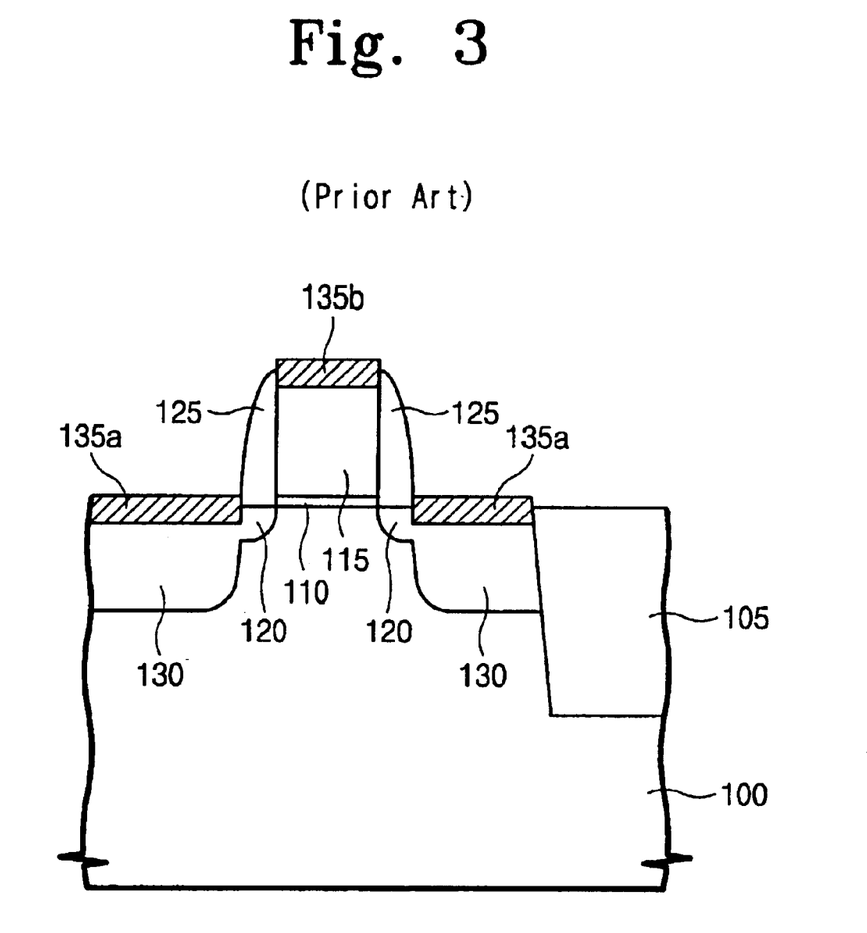

Referring to FIG. 3, a silicide layer 135a and 135b is formed on a top of the active region and on the gate electrode 115. A cobalt layer is deposited using sputtering and a thermal process is then applied to the resultant structure. The thermal process may allow the cobalt layer to react with the active region and the gate electrode 125, thereby creating cobalt silicide. In contrast, a silicide reaction may not occur on the field region 105 and on the spacer 125. A cleaning process using a mixed solution of sulfuric acid ($H_2SO_4$) and oxygenated water ($H_2O_2$) is applied to the semiconductor substrate when the thermal process is completed. Thus, the unsilicided metal material can be removed. The silicide layer 135a and 135b can decrease the resistance and capacitance associated with the contacts subsequently formed, thereby accelerating the speed of the devices.

Figure 4:
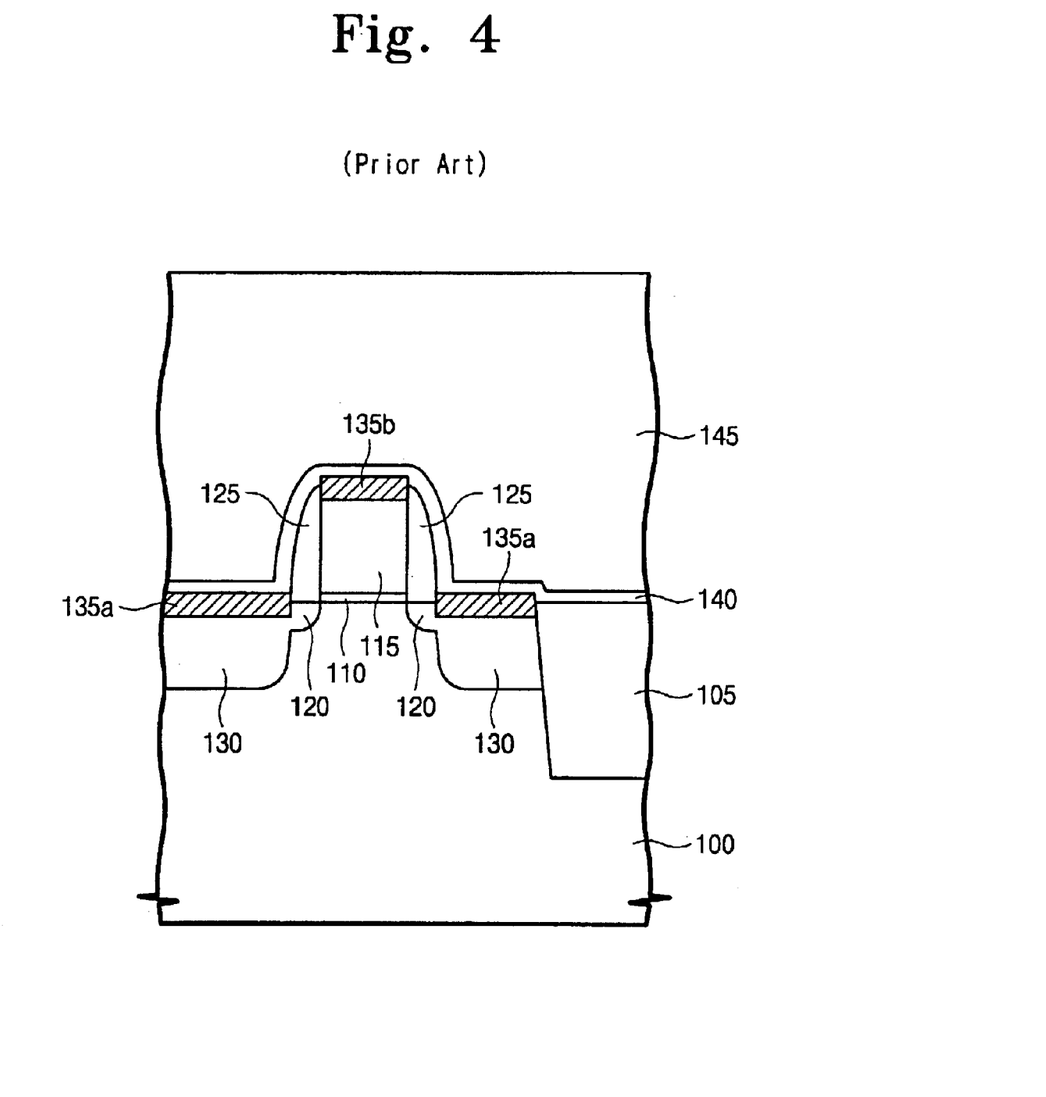

Referring to FIG. 4, an etch stop layer 140 is formed on an entire surface of the substrate and on the silicide layer 135a and 135b. An interlayer dielectric (ILD) 145 is then formed on the substrate including the etch stop layer 140.

Figure 5:
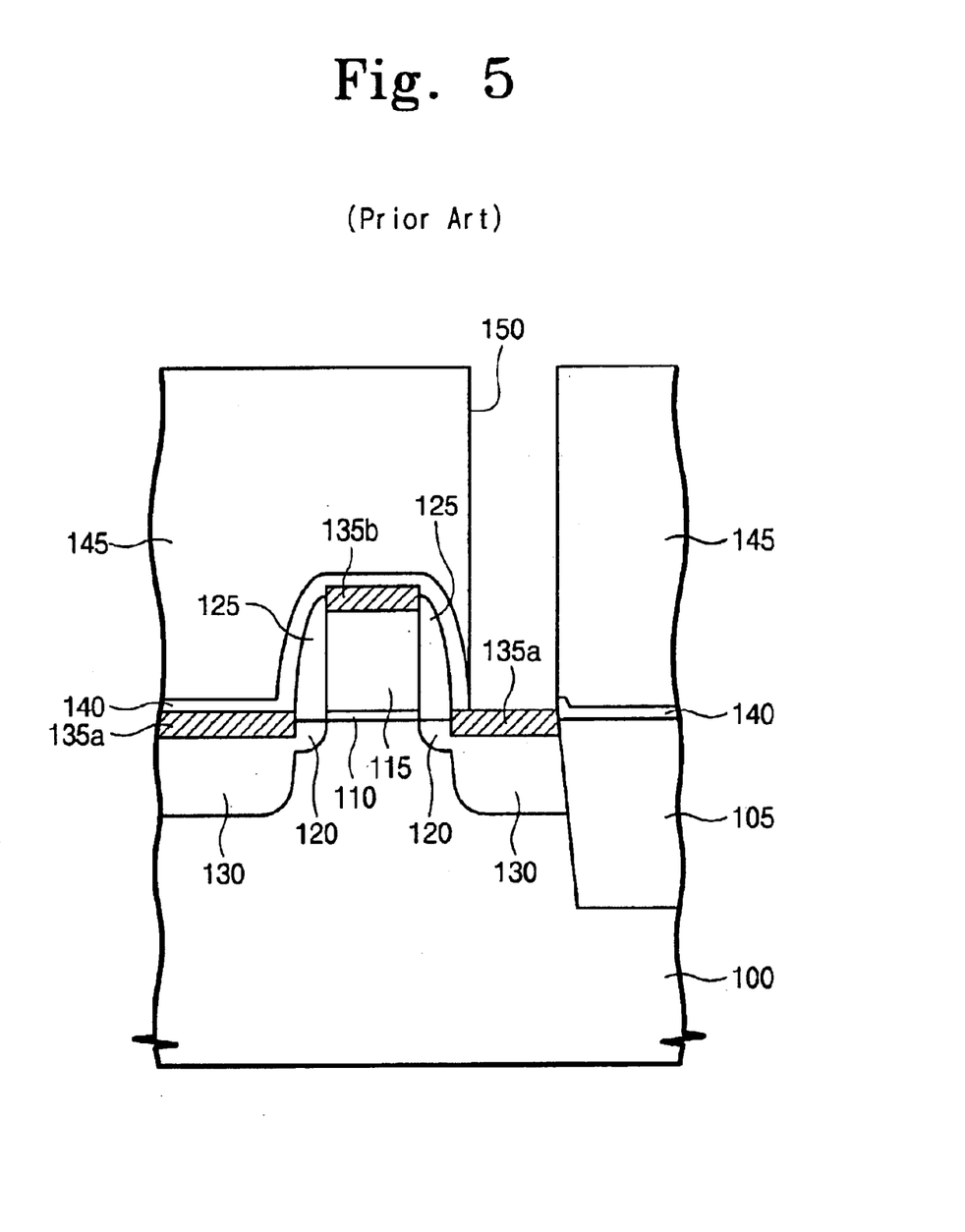

Referring to FIG. 5, the ILD 145 and the etch stop layer 140 are selectively etched to form a contact hole 150 exposing the active region between the gate electrode 115 and the field region 105. Although not shown in the drawings, the contact hole 150 can be filled with a barrier metal layer and a conductive material.

Figure 6:
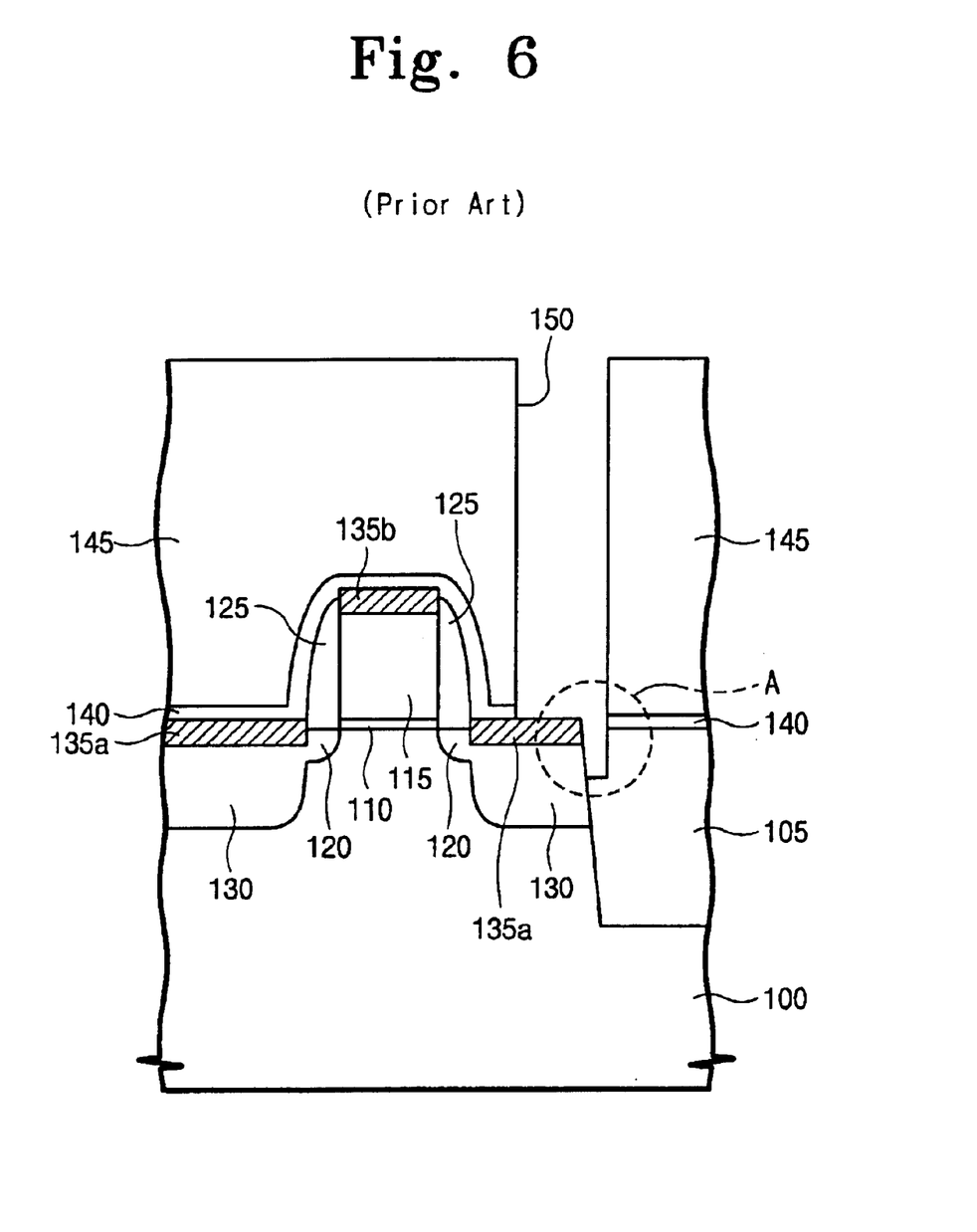
Figure 7:
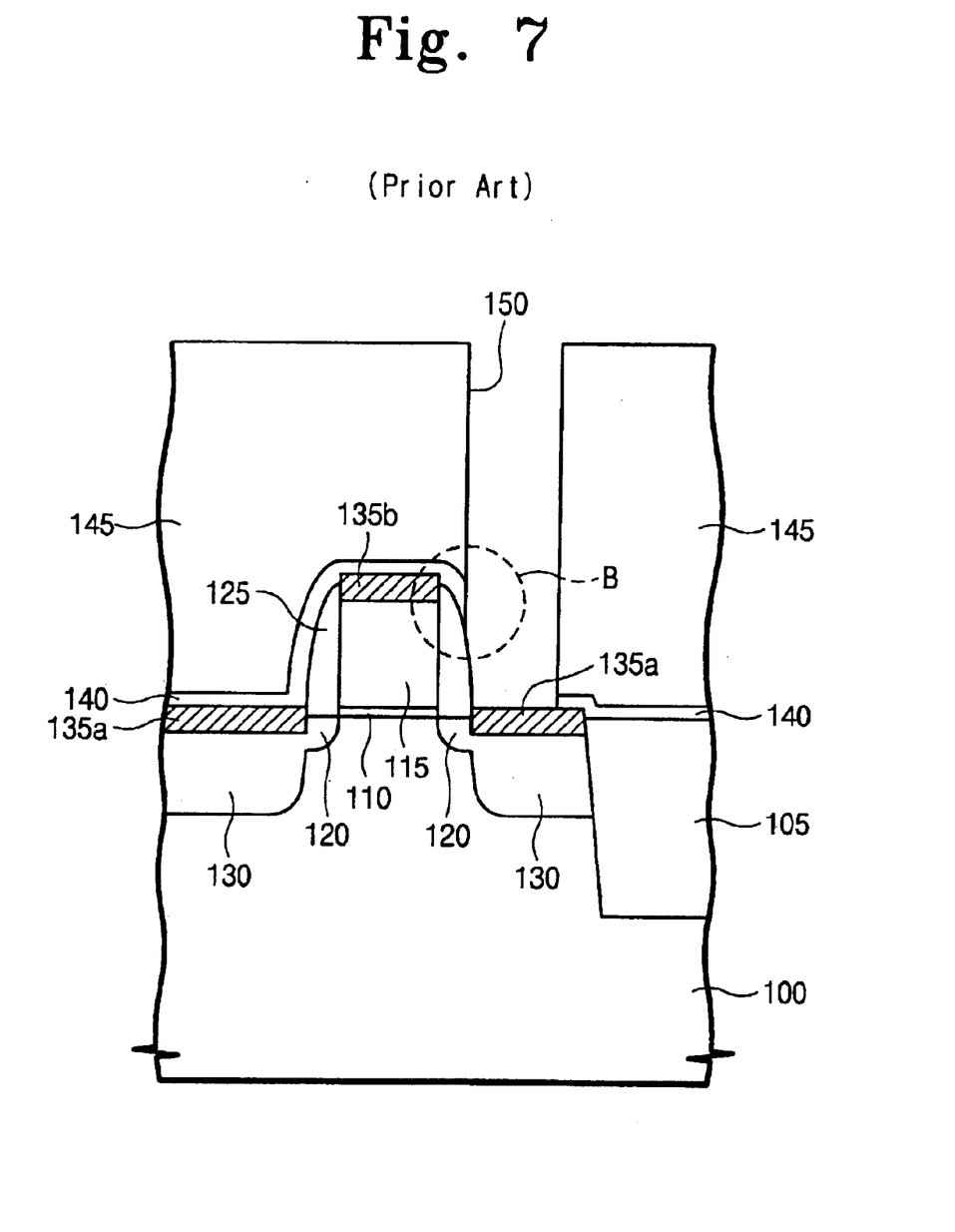

The contact hole 150 can be formed misaligned to the silicide layer 135a, which may give rise to problems such as those illustrated in FIGS. 6 and 7.

FIG. 6 shows the contact hole 150 misaligned to the silicide layer 135a as denoted by reference designator A in a borderless contact. The borderless contact can be created by exposing a portion of the field region 105 and a surface of the semiconductor substrate adjacent thereto. As shown in FIG. 6, the misalignment may cause a recess in the exposed field region 105. If a depth of the recess is more than that of a source/drain junction, or if the recess is close to a junction boundary line, the contact may be formed to be in electrical contact with the substrate, which may result in increased leakage current. It is known that as a junction becomes shallower, the borderless contact can generate increased leakage current.

FIG. 7 shows the contact hole 150 misaligned to the silicide layer 135a as denoted by reference designator B such that the contact hole 150 is formed over the spacer. In this case, an open region of the contact hole 150 may be reduced, or may even be nearly closed. As an open area of the contact hole decreases, the contact resistance increases. Furthermore, the barrier metal layer and metal may not be fully deposited to a bottom of the contact hole, thereby deteriorating the reliability of the devices.

The extended active region, the contact hole being formed, with narrow spacer on the side walls of the gate electrode can solve the foregoing problems. However, if a width of the spacer 124 is reduced, it may not be possible to form the transistor with the LDD structure having the characteristics deemed desirable.

SUMMARY

Embodiments according to the present invention can provide methods of forming source/drain regions using multilayer side wall spacers. Pursuant to these embodiments, methods of forming a source/drain region can include forming a gate electrode on a substrate and forming a lightly doped source/drain region in the substrate self-aligned to the gate electrode. A first spacer can be formed on a side wall of the gate electrode. A second spacer can be formed on the first spacer on the side wall separate from the first spacer to provide a multilayer spacer on the side wall. A heavily doped source/drain region can be formed in the substrate self-aligned to the multilayer spacer.

In some embodiments according to the present invention, the methods can further include forming an etch stop layer between the first and second spacers. In some embodiments according to the present invention, the methods can further include removing at least a portion of the second spacer to expose a surface of the lightly doped source/drain region. In some embodiments according to the present invention, the methods can further include siliciding a surface of the substrate on the lightly doped source/drain region to provide a contact on the lightly doped source/drain region.

In some embodiments according to the present invention, the methods can further include forming an etch stop layer on a side wall of the first spacer that is on the substrate above the lightly doped source/drain region.

In some embodiments according to the present invention, the etch stop layer has a thickness in a range between about 50 Angstrom and about 1000 Angstroms. In some embodiments according to the present invention, the first spacer has a thickness in a range between about 50 Angstrom and about 1000 Angstroms. In some embodiments according to the present invention, the second spacer has a thickness in a range between about 50 Angstrom and about 1000 Angstroms. In some embodiments according to the present invention, the lightly doped source/drain region extends in the substrate beyond an outer side wall of the first spacer toward the heavily doped source/drain region.

In some embodiments according to the present invention, a gate electrode is formed on the active region adjacent to the field region. At this time, a gate insulation layer is intervened between the active region and the gate electrode. By using the gate electrode and the field region as an ion implantation mask, impurity ions are implanted at a low concentration to form a lightly doped region. A double spacer, which is configured with an inner spacer and an outer spacer, is formed on side walls of the gate electrode. Impurity ions are implanted at a high concentration by using the gate electrode where the inner spacer and the outer spacer are formed on the side walls thereof and the field region as an ion implantation mask, to form a heavily doped region. Thereafter, the outer spacer is removed. At this time, the active region adjacent to the gate electrode is extended by a width of the outer spacer. A suicide layer may be formed on the active region to lower a sheet resistance. An interlayer dielectric (ILD) is formed on an entire surface of the substrate. The resultant ILD is selectively etched to form a contact hole, which exposes at least a portion of the active region between the gate electrode and the field region. Because the contact hole is formed in the active region extended by the width of the outer spacer or under an extended process margin, a problem caused by a misalignment may be prevented.

In other embodiments according to the present invention, a gate structure of a MOSFET can include a gate electrode on a substrate and a heavily doped source/drain region in the substrate spaced-apart from the gate electrode. A lightly doped source/drain region can be in the substrate between the heavily doped source/drain region and the gate electrode. A spacer can be on a side wall of the gate electrode having a thickness at a base thereof that is less than the width of the lightly doped source/drain region.

In some embodiments according to the present invention, the gate structure can further include a silicided contact on a surface of the substrate on the lightly doped source/drain region that is within a range between about 50 Angstrom and about 500 Angstroms from the side wall of the gate electrode. In some embodiments according to the present invention, the spacer has a thickness in a range between about 50 Angstrom and about 1000 Angstroms.

DESCRIPTION OF EMBODIMENTS ACCORDING TO THE INVENTION

The present invention now will be described more fully hereinafter with reference to the accompanying drawings, in which typical embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity.

It will be understood that when an element such as a layer, region or substrate is referred to as being "on" another element, it can be directly on the other element or intervening elements may also be present. In contrast, when an element is referred to as being "directly on" another element, there are no intervening elements present. Each embodiment described and illustrated herein includes its complementary conductivity type embodiment as well.

Furthermore, relative terms, such as above, may be used herein to describe one layer or regions relationship to another layer or region as illustrated in the Figures. It will be understood that these terms are intended to encompass different orientations of the device in addition to the orientation depicted in the Figures. For example, if the device in the Figures is turned over, layers or regions described as "beneath" other layers or regions would now be oriented "above" these other layers or regions. The term "above" is intended to encompass both above and beneath in this situation.

Figure 8:
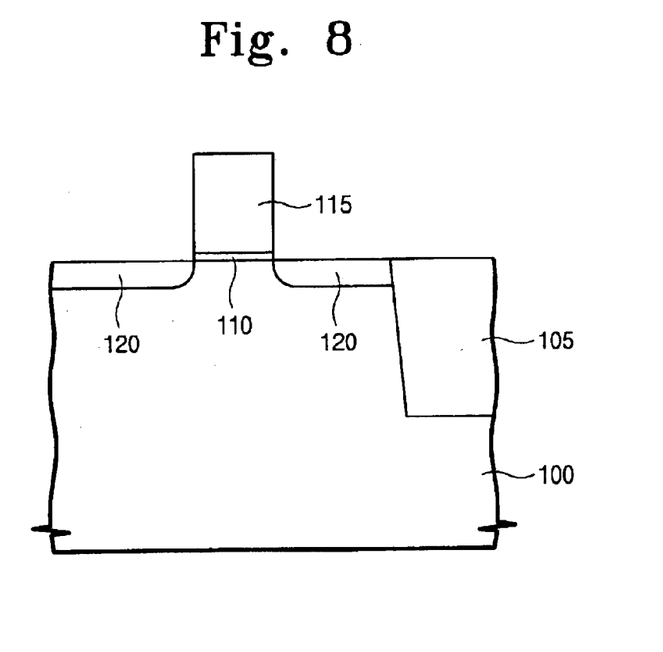
FIGS. 8 to 13 are cross-sectional views illustrating method embodiments of fabricating semiconductor devices having contacts connected to a MOS transistor according to embodiments of the present invention.

FIGS. 8 to 13 are cross-sectional views illustrating method embodiments for fabricating semiconductor devices having contacts connected to MOS transistors according to embodiments of the present invention. Referring to FIG. 8, a field region 105 is formed in a substrate 100 to define an active region. The substrate 100 is etched to form a trench, which is filled with an insulating material. The insulating material is polished using, for example, chemical mechanical polishing (CMP), thereby forming a field region 105.

An insulation layer and a gate conductive layer are sequentially formed on the substrate including on the field region 105. The insulation layer and the gate conductive layer are patterned to form a gate electrode 115. The insulation layer beneath the gate conductive layer remains to provide a gate insulation layer 110 between the substrate 100 and the gate electrode 1115, which together can constitute a gate structure. The gate conductive layer may be formed of at least one material selected from the group consisting of silicon germanium (SiGe), cobalt (Co), tungsten (W), titanium (Ti), nickel (Ni), tantalum (Ta), titanium nitride (TiN), tantalum nitride (TaN), and tungsten nitride (WN), in addition to impurity doped polysilicon.

Figure 9:
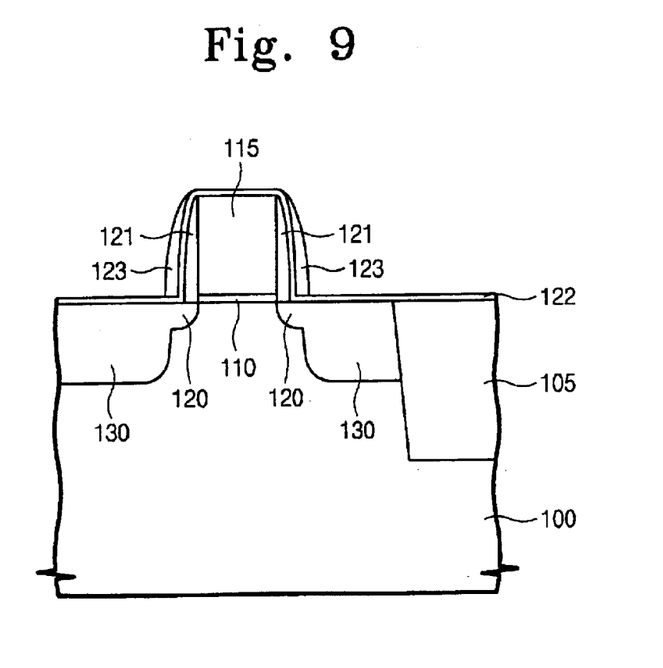

Impurity ions are implanted at a low concentration by using the gate electrode 115 and the field region 105 as an ion implantation mask, to form a lightly doped source/drain region 120. Referring to FIG. 9, an inner spacer insulation layer is formed on the substrate and is etched using an anisotropic etch process, thereby forming an inner spacer 121 on side walls of the gate electrode 115 above the lightly doped source/drain region 120. In some embodiments according to the present invention, the inner spacer insulation layer is formed of one of silicon nitride (SiN) and silicon oxynitride (SiON) to a thickness of approximately 50 to 100 Å.

A first etch stop layer 122 and an outer spacer insulation layer are sequentially formed on the substrate. The outer spacer insulation layer is etched using an anisotropic etch process until the first etch stop layer 122 is exposed, leaving the portion of the outer spacer insulation layer on the side wall of the gate electrode 115 covered. Thus, an outer spacer 123 is formed on side walls of the inner spacer 121 thereby forming a multilayer spacer on the side wall. The first etch stop layer 122 is located between the side walls of the inner spacer 121 and the outer spacer 123. In some embodiments according to the present invention, the first etch stop layer 122 is formed of silicon nitride (SiN) to a thickness of approximately 50 to 500 Å. In some embodiments according to the present invention, the outer spacer 123 is formed of silicon oxide ($SiO_2$) to a thickness of approximately 50 to 1000 Å.

Using the gate electrode 115, the inner spacer 121, the outer spacer 123, and the field region 105 as an ion implantation mask, impurity ions are implanted at a high concentration to form a heavily doped source/drain region 130.

Figure 10:
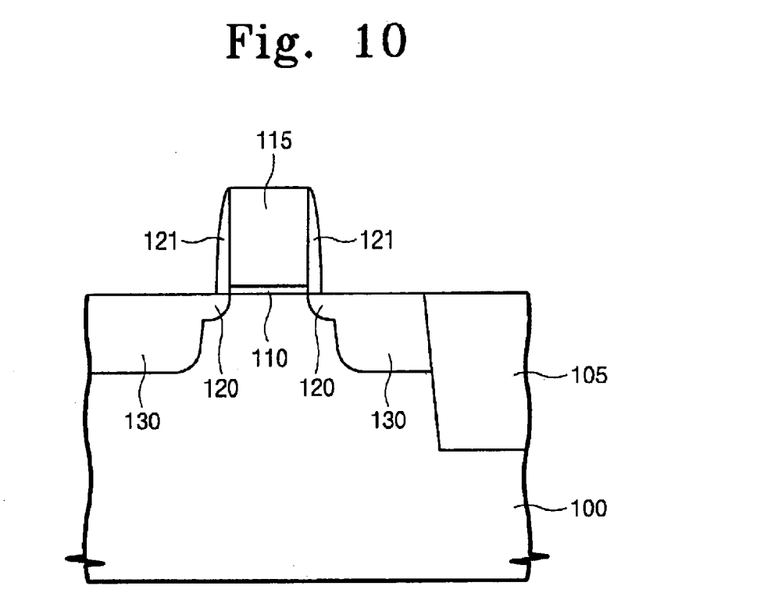

Referring to FIG. 10, the outer spacer 123 is removed using a wet etch process. The first etch stop layer 122 protects the substrate from the etchant during the wet etch process for removing the outer spacer 123. After removing the outer spacer 123, an additional ion implantation process may be implemented to form a three-stage profile source/drain region.

Next, the first etch stop layer 122 is removed to expose a surface of the active region and a top of the gate electrode 115. The exposed active region becomes wider by a width of the removed outer spacer. Stated differently, the lightly doped source/drain region extends beyond an outer side wall of the inner spacer 121 toward the heavily doped source/drain region 130.

Figure 11:
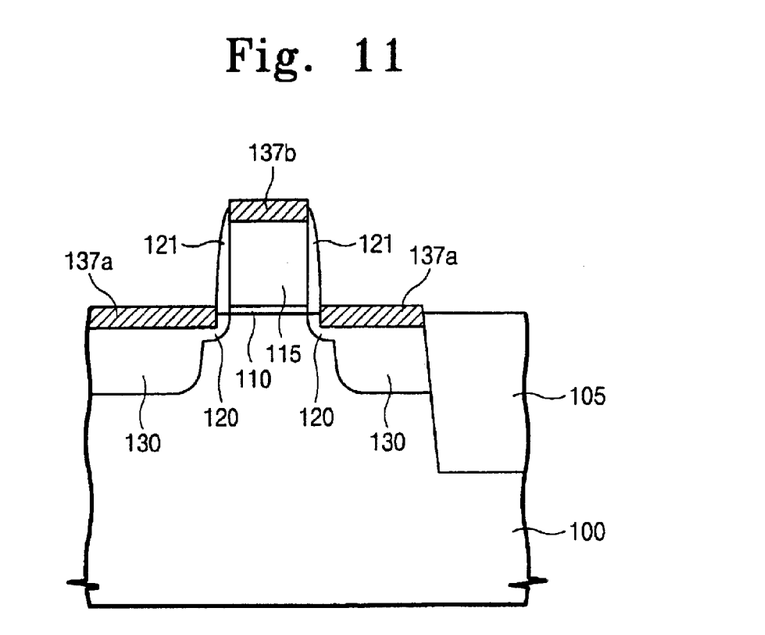

Referring to FIG. 11, a salicide process is applied to the exposed surface of the active region and the exposed top of the gate electrode 115, thereby forming a silicide layer 137a and a gate silicide layer 137b. In some embodiments according to the present invention, the gate silicide layer 137b may not be formed, depending on the material used to form the gate electrode 115. In some embodiments according to the present invention, the silicide layer 137a and the gate silicide layer 137b may be formed of one selected from the group consisting of cobalt (Co), titanium (Ti), nickel (Ni), tungsten (W), platinum (Pt), hafnium (Hf), and palladium (Pd). An example using cobalt will be described in conjunction with the present embodiment according to the present invention.

A cleaning process is carried out to remove a natural oxide layer from the exposed surface of the active region and the surface of the gate electrode 115. A cobalt layer is then deposited using sputtering. In some embodiments according to the present invention, a two-step thermal process is used to form the silicide layer. A first thermal process is used to form cobalt monosilicide (CoSi). The first thermal process can be carried out in a conventional rapid thermal annealer at a temperature in a range between about 400 and about 600° C., which causes a silicide reaction where the cobalt is in contact with silicon. A cleaning process is applied to the semiconductor substrate when the thermal process is completed to remove the unsilicided cobalt layer. In some embodiments according to the present invention, the cleaning process uses a mixed solution of sulfuric acid ($H_2SO_4$), oxygenated water ($H_2O_2$), and water ($H_2O$). A second thermal process is conducted at about 750° C. or higher such that the cobalt monosilicide (CoSi) is changed in phase to cobalt disilicide ($CoSi_2$) having a low resistivity.

In other embodiments according to the present invention, the silicide layer can be formed using a one-step thermal process. In other words, a cobalt layer is formed and is directly annealed at 750° C. or higher. Thereafter, a cleaning process is carried out to remove the unsilicided cobalt layer to provide the silicide layer.

The foregoing silicide layer is formed on a wider active region as compared to the conventional method. Accordingly, a substantial sheet resistance at the source/drain region becomes lower.

Figure 12:
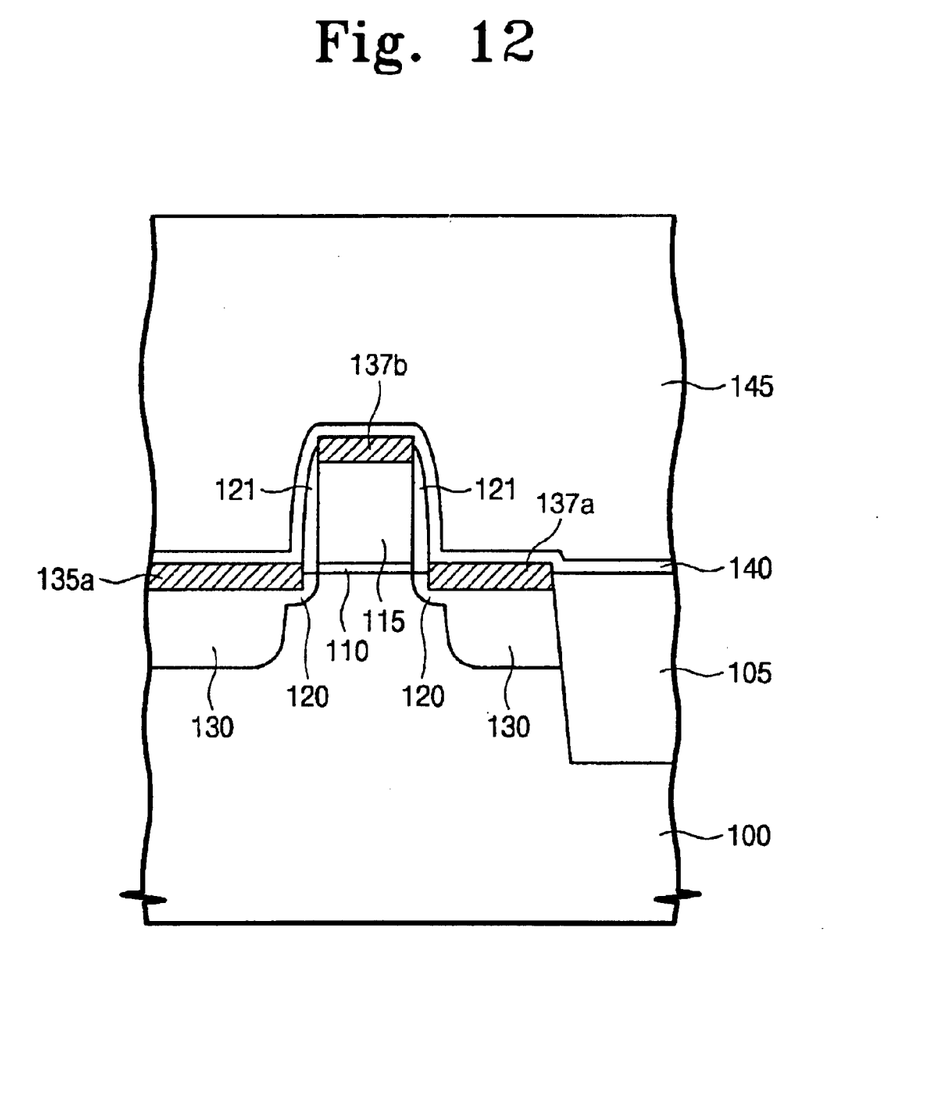

Referring to FIG. 12, a second etch stop layer 140 is formed on the surface of the substrate and an interlayer dielectric (ILD) is formed thereon. In some embodiments according to the present invention, the second etch stop layer 140 is formed of one of silicon nitride SiN, and silicon oxynitride (SiON) to a thickness of approximately 50 to 1000 Å. In some embodiments according to the present invention, the ILD 145 is a material selected from the group consisting of silicon oxide, boro-phosphosilicate glass (BPSG), and phosphor silicate glass (PSG). The ILD 145 may be formed using low pressure CVD or plasma CVD to a thickness of approximately 1000 to 10000 Å.

Figure 13:
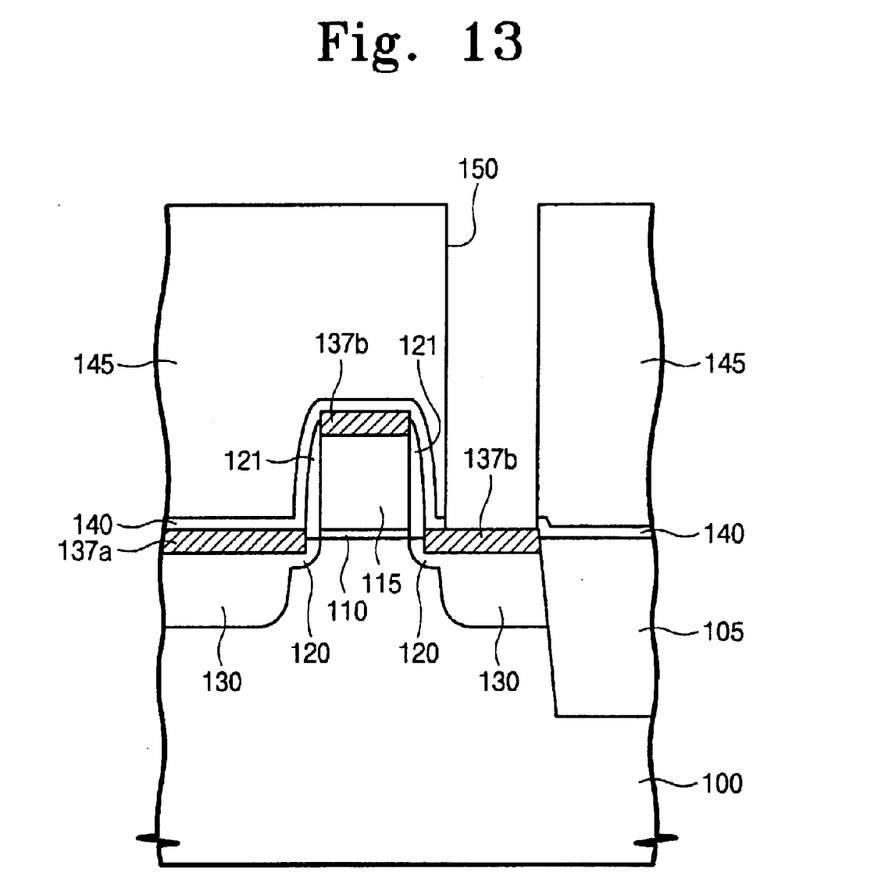

Referring to FIG. 13, the ILD 145 and the second etch stop layer 140 are selectively etched to form a contact hole 150, which exposes the silicide layer 137b between the gate electrode 115 and the field region 105. Although not shown in the drawings, the contact hole 150 is filled with a barrier metal layer and a conductive material.

According to the present invention as set forth before, a spacer insulation layer formed on side walls of a gate electrode is formed of multiple layers (such as a double layer). Thus, a margin of a region of a contact hole can be extended so as to lower a contact resistance. In particular, as compared with the conventional method, the contact hole 150 may be formed having an improved process margin that is greater by a width of the outer spacer 123. That is, it is possible to reduce an increase in leakage current caused by a borderless contact or an increase in contact resistance caused by the spacer formed on the side walls of the gate electrode. In addition, a silicide layer may be formed even on a region extended by a width of the outer spacer, so as to lower a sheet resistance. Furthermore, an additional ion implantation process may be implemented after forming an inner spacer or after removing an outer spacer, thereby forming a source/drain region of a three-stage profile.

In the drawings and specification, there have been disclosed typical embodiments of the invention and, although specific terms are employed, they are used in a generic and descriptive sense only and not for purposes of limitation, the scope of the invention being set forth in the following claims.

What is claimed:

1. A method of forming a source/drain region, the method comprising:
   forming a gate electrode on a substrate;
   forming a lightly doped source/drain region in the substrate self-aligned to the gate electrode;
   forming a first spacer on a side wall of the gate electrode to expose a part of the substrate;
   conformally forming an etch stop layer to cover the gate electrode, the first spacer, and the substrate;
   forming a second spacer on the etch stop layer on the first spacer on the side wall separated from the first spacer to provide a multilayer spacer on the side wall;
   forming a heavily doped source/drain region in the substrate by using the gate electrode, the first spacer and the second spacer as ion implantation masks;
   and on the etch stop layer on the first spacer on the side wall of the gate electrode; and
   forming a silicided contact on the source/drain region self-aligned to the first spacer.

2. A method according to claim 1 wherein the etch stop layer has a thickness in a range between about 50 Angstrom and about 1000 Angstroms.

3. A method according to claim 1 wherein the first spacer has a thickness in a range between about 50 Angstrom and about 1000 Angstroms.

4. A method according to claim 1 wherein the second spacer has a thickness in a range between about 50 Angstrom and about 1000 Angstroms.

5. A method according to claim 1 wherein the lightly doped source/drain region extends in the substrate beyond an outer side wall of the first spacer toward the heavily doped source/drain region.

6. A method according to claim 1 wherein the first spacer is a single spacer between the suicide layer and the side wall.

7. A method for fabricating a semiconductor device, comprising:
   forming a field region at a substrate to define an active region;
   forming a gate electrode on the active region adjacent to the field region, wherein a gate insulation layer is interposed between the active region and the gate electrode;
   forming a lightly doped region in the active region by using the gate electrode and the field region as an ion implantation mask;
   forming an inner spacer on a side wall of the gate electrode to expose part of the active region and the field region;
   conformally forming a first etch stop layer to cover the gate electrode, the inner spacer, the active region, and the field region;
   forming an outer spacer on the first etch stop layer on the inner spacer on the side wall of the sate electrode;
   forming a heavily doped region in the active region by using the gate electrode, the inner spacer, the outer spacer and the field region as an ion implantation mask;
   removing the outer spacer on the first etch stop layer on the first spacer on the side wall of the gate electrode;
   removing the first etch stop layer;
   forming a silicide layer on the active region and on an upper surface of the gate electrode;
   forming an interlayer dielectric on an entire surface of the substrate; and
   selectively etching the interlayer dielectric to form a contact hole that exposes at least a portion of the active region between the gate electrode and the field region, wherein the inner spacer is a single spacer between the silicide layer and the side wall.

8. The method as claimed in claim 7, wherein the first etch stop layer is formed of silicon nitride (SiN) to a thickness of approximately 50 to 500 Å.

9. The method as claimed in claim 7, wherein forming the silicide layer comprises:
   forming a metal layer on an entire surface of the substrate including the active region;
   applying a thermal process to the metal layer to allow the metal to react on the active region; and
   removing the unreacted metal from the metal layer.

10. The method as claimed in claim 9, further comprising applying a thermal process to the silicide layer.

11. The method as claimed in claim 9, wherein the metal layer is formed of one selected from the group consisting of cobalt (Co), titanium (Ti), nickel (Ni), tungsten (W), platinum (Pt), hafnium (Hf), and palladium (Pd).

12. The method as claimed in claim 11, wherein when the metal layer is formed of cobalt, the unreacted metal is removed by a wet etch process using a mixed solution of sulfuric acid ($H_2SO_4$), oxygenated water ($H_2O_2$), and water ($H_2O$).

13. The method as claimed 7, further comprising:
   forming a second etch stop layer on an entire surface of the substrate including the silicide layer after forming the silicide layer; and
   selectively etching the second etch stop layer when the contact hole is formed.

14. The method as claimed in claim 7, further comprising implementing an ion implantation process after removing the outer spacer.

15. The method as claimed in claim 7, wherein the inner spacer is formed of one of silicon nitride and silicon oxynitride.

16. The method as claimed in claim 7, wherein the outer spacer is formed of silicon oxide.

17. A gate structure of a MOSFET comprising:
   a gate electrode on a substrate;
   a heavily doped source/drain region in the substrate spaced-apart from the gate electrode;
   a lightly doped source/drain region in the substrate between the heavily doped source/drain region and the gate electrode;
   a spacer on a side wall of the gate electrode having a thickness at a base thereof that is less than the width of the lightly doped source/drain region; and
   a silicide layer on the lightly doped source/drain region extending to the spacer, wherein the spacer is a single spacer between the silicide layer and the side wall.

18. A structure according to claim 17 wherein the spacer has a thickness in a range between about 50 Angstrom and about 500 Angstroms.

* * * * *